(12) United States Patent
Duperray et al.

(10) Patent No.: US 6,344,430 B1
(45) Date of Patent: Feb. 5, 2002

(54) MULTIFILAMENT STRAND WITH AG CLADDING AND A COATING OF OXYGEN-PERMEABLE CERAMIC

(75) Inventors: Gérard Duperray, La Norville; Fernard Grivon, Saint-Michel-sur-Orge; Peter Friedrich Herrmann, Corbeuse, all of (FR)

(73) Assignee: Nexans, Paris (FR)

( * ) Notice: Subject to any disclaimer, the term of this patent is extended or adjusted under 35 U.S.C. 154(b) by 0 days.

(21) Appl. No.: 09/598,910

(22) Filed: Jun. 22, 2000

Related U.S. Application Data

(62) Division of application No. 09/049,081, filed on Mar. 27, 1998, now Pat. No. 6,110,873.

(30) Foreign Application Priority Data

Mar. 27, 1997 (FR) .......................................... 97 03752

(51) Int. Cl.[7] .............................................. H01B 12/00
(52) U.S. Cl. ..................... 505/237; 174/125.1; 505/231
(58) Field of Search ....................... 174/125.1; 505/230, 505/231, 236, 237, 704, 884, 887

(56) References Cited

U.S. PATENT DOCUMENTS

| | | | |
|---|---|---|---|
| 4,977,039 A | * 12/1990 | Onishi et al. | 428/623 |
| 5,043,320 A | * 8/1991 | Meyer et al. | 505/704 |
| 5,319,843 A | * 6/1994 | Primdahl Iversen et al. | 29/599 |
| 5,330,969 A | 7/1994 | Finnemore et al. | |
| 5,849,670 A | * 12/1998 | Nabatame et al. | 505/230 |
| 5,972,846 A | * 10/1999 | Jin et al. | 505/126 |

FOREIGN PATENT DOCUMENTS

WO  WO 96/28853  9/1996

OTHER PUBLICATIONS

Y.B. Huang et al., "Fabrication and Microstructure of Bi(2223) Multifilamentary Tapes with low AC Losses," SPA '97, Mar. 6–8, 1997 (China).

Martini, Supercond. Sci. Technol. 11 pp. 231–237 (1998).

* cited by examiner

*Primary Examiner*—Kamand Cuneo
(74) *Attorney, Agent, or Firm*—Sughrue Mion, PLLC

(57) ABSTRACT

A powder in tube type method of making an HTc superconductive multifilament strand having a silver-based matrix, and an HTc superconductive multifilament strand having a silver-based matrix. The method includes, prior to the monofilament step, preparing a composite multilayer material is including at least one silver-based sheet, and at least one layer of non-superconductive ceramic material that is permeable to oxygen. During the monofilament step, a thickness of composite multilayer material is interposed between first and second thicknesses of silver-based material, thereby forming the first silver-based envelope.

4 Claims, 3 Drawing Sheets

MULTIFILAMENT STRAND WITH AG CLADDING AND A COATING OF OXYGEN-PERMEABLE CERAMIC

This is a divisional of Application Ser. No. 09/049,081 filed Mar. 27, 1998, now U.S. Pat. No. 6,110,873 the disclosure of which is incorporated herein by reference.

The invention relates to a high critical temperature (HTc) superconductive multifilament strand and to a method of making such a strand. More particularly, the invention relates to an HTc superconductive multifilament strand clad in silver and used with AC, and to a method of making such a strand.

BACKGROUND OF THE INVENTION

The use of HTc superconductive multifilament strands with AC causes power losses due to induced currents. It is known to reduce such losses by twisting the conductor at a very small pitch with a very small filament diameter. However, that is effective only if the filaments are electrically decoupled from one another by means of a resistive barrier.

It is known to make HTc multifilament strands by the "powder in tube" technique. That consists in filling a billet with powder reagents that are suitable, after heat treatment, for transforming into a superconductive material, and in particular into a material of the HTc ceramic type.

The billet is then closed under a vacuum and drawn down, after which it is put into a bundle in a new billet, itself in turn closed under a vacuum and then drawn down. The resulting multifilament strand may be subjected to the same steps, and so on until a desired number of filaments per unit area has been obtained.

The strand made in this way is then put into its final form, e.g. by rolling and/or twisting, and is then subjected to heat treatment to transform its powder reagents.

The material constituting the billets must be sufficiently ductile to be capable of withstanding the various drawing-down and rolling stages, and its composition must be inert or at least without consequence for the heat treatment that transforms the powder reagents into a superconductive phase. It is known that silver can be used as the material constituting the billets.

However, silver is a material that is very highly conductive at the operating temperatures of HTc super-conductors. As a result there is practically no electrical decoupling between the filaments.

It is known that Ag can be doped with impurities of the Pd or Au type to 1% or 2%. That technique makes it possible to gain two decades in resistivity at 20 K.

However, the Ag/Pd alloy is expensive which makes it economically inconceivable in mass production applications.

It is also known to make at least one multilayer composite billet comprising at least one outer thickness of metal alloy, at least one of whose components is oxidizable, and an inner thickness of silver.

Heat treatment is then applied so that the oxidizable components of the metal alloy diffuse at the interface between the metal alloy and the silver and, in the presence of oxygen or of oxygen-containing compounds, oxidize to form an insulating oxide at said interface.

Filament decoupling is thus significantly improved. However, making such an oxide barrier consumes oxygen, thereby preventing the precursors from being properly synthesized into the superconductive phase.

To mitigate that problem, it has been proposed (Y.B. HUANG, R. FLUKIGER, in an article presented to SPA'97, Mar. 6–8, 1997, XU'AN, China) to use as an insulating barrier a compound that behaves in the same way as the precursors, i.e. that is permeable to oxygen while being a poor superconductor at the operating temperatures of HTc multifilament strands. Such a compound is known, e.g. Bi2202 which is not a good super-conductor, or Bi2212 degenerated by Al, Mg, or Ti pollution. With Bi2212, $SrAl_2O_4$ or $CaAl_2O_4$ is created, for example, thereby departing from the stoichiometry necessary to have a Bi2212 superconductive phase.

OBJECTS AND SUMMARY OF THE INVENTION

One of the objects of the present invention is to propose a method that uses the latter approach and that enables a multifilament strand to be made that is very long and in which filament decoupling is significantly improved, while retaining good permeability to oxygen in the non-conductive layer for the purposes of synthesizing precursors into the superconductive phase.

To this end, the invention provides a powder in tube type method of making an HTc superconductive multifilament strand having a silver-based matrix, in which method:

in a monofilament step, a first silver-based envelope is filled with powder reagents suitable, after heat treatment, for transforming into an HTc superconductive material;

the resulting billet is drawn down into a monofilament strand;

in a first multifilament step, said monofilament strand is cut into lengths and a secondary silver-based envelope is filled with the resulting lengths, thereby making a multifilament billet, the multifilament billet being drawn down in turn to form a multifilament strand;

in a secondary multifilament step performed at least once, said multifilament strand is cut into lengths and a new silver-based envelope is filled with the resulting lengths, thereby making a new multifilament billet, the new multifilament billet being drawn down in turn to form a new multifilament strand;

the new multi-filament strand is formed; and heat treatment is applied to the formed strand;

according to the invention, in a step performed prior to the monofilament step:

a composite multilayer material is prepared using a method derived from the method described in European Patent Document EP 0 531 188 dated Dec. 11, 1996, the composite multilayer material comprising at least one silver-based sheet, and at least one layer of non-superconductive ceramic material that is permeable to oxygen; and during the mono-filament step, a thickness of composite multilayer material is interposed between first and second thicknesses of silver-based material, thereby forming said first silver-based envelope.

In order to improve the performance of the multifilament strand further, the cross-sections of the first silver-based envelope, of the monofilament strand, of the secondary silver-based envelope, of the multifilament strand, of the new silver-based envelope, and of the new multifilament strand are preferably square or rectangular in overall shape, although any other shape, e.g. round or hexagonal, is also acceptable.

In one implementation, to prepare the composite multilayer material:

a polymer is mixed with a powder that is suitable, after heat treatment, for transforming into a non-superconductive ceramic material that is permeable to oxygen, mixing taking place at a temperature. approximately equal to the melting point of the polymer in question so to obtain a homogeneous polymer-and-powder mixture;

at least one sheet of silver is hot compressed with the polymer-and-powder mixture at a temperature approximately equal to the melting point of the polymer in question so as to obtain an intermediate composite multilayer material comprising silver alloy and homogeneous polymer-and-powder mixture; and the composite multilayer material comprising silver alloy and homogeneous polymer-and-powder mixture is baked at approximately the melting point of the powder to remove the polymer, to make the powder synthesize into non-superconductive ceramic that is permeable to oxygen, and to make the non-superconductive ceramic that is permeable to oxygen adhere to the sheet of silver, thereby making the composite multi-layer material.

Provision may be made to hot compress the homogeneous polymer-and-powder mixture between two silver-based sheets.

The thickness of the layer of-homogeneous polymer-and-powder mixture is chosen as a function of the thickness desired for the oxygen-permeable non-superconductive ceramic around the monofilaments of the formed new multifilament strand.

In one implementation, the powder is based on Bi2212 polluted with Al, Mg, or Ti, for example.

In another implementation, the powder is based on Bi2201.

The invention further provides an HTc superconductive multifilament strand comprising a plurality of superconductive filaments, each superconductive filament comprising an HTc superconductive ceramic core surrounded by first cladding of an Ag-based alloy, itself surrounded by a layer of non-superconductive ceramic that is permeable to oxygen, itself surrounded by second cladding of an Ag-based alloy.

A first advantage of the present invention results from the fact that the compositions of the precursors and of the non-superconductive ceramic are similar. This mitigates any problem of chemical incompatibility.

Another advantage of the present invention results from the fact that the mechanical and/or heat treatment steps of the method of the invention are unchanged compared with conventional steps. This means that existing installations can be used without it being necessary to adapt them.

Compared with silver, the ceramic barrier offers resistivity gains of about $10^3$ at 300 K and about $10^5$ at 20 K.

BRIEF DESCRIPTION OF THE DRAWINGS

Other advantages and characteristics of the present invention appear from the following description given with reference to the accompanying drawings, in which.

MORE DETAILED DESCRIPTION

Figure 1:
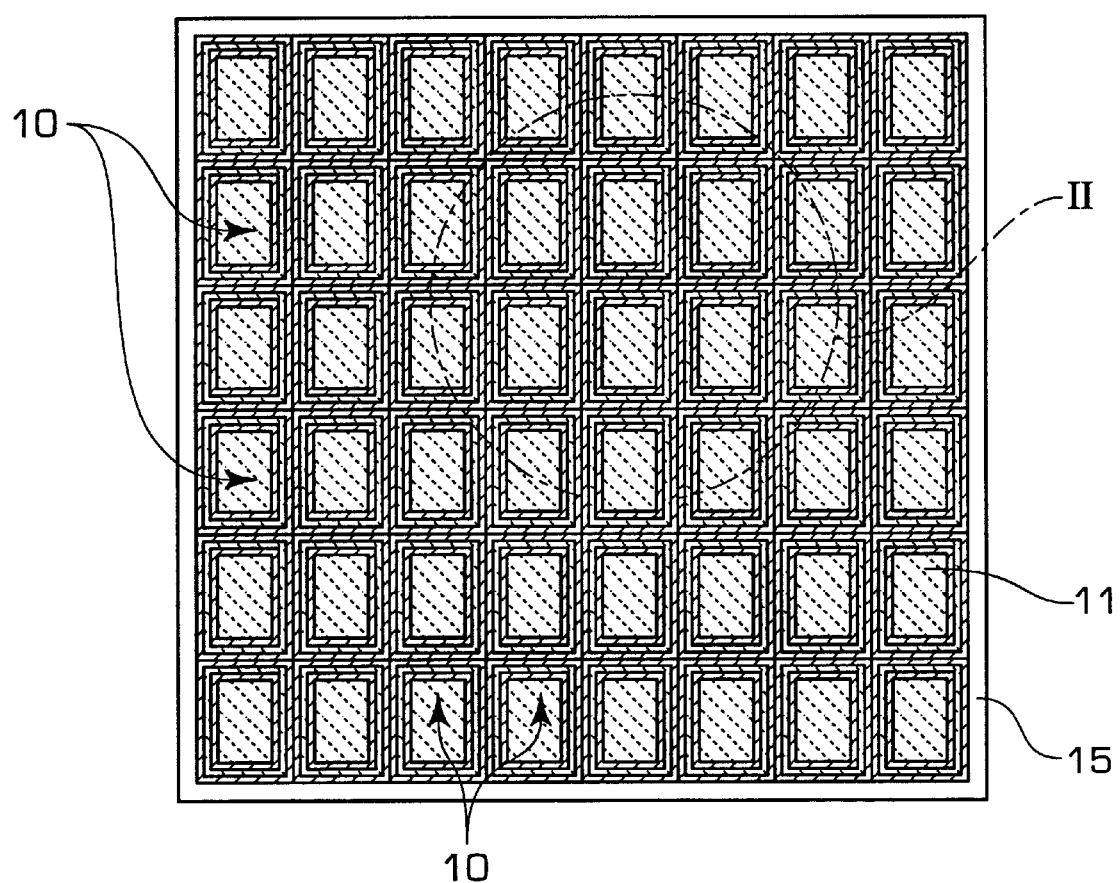
FIG. 1 is a cross-section view of a square version of a multifilament strand of the invention.
Figure 2:
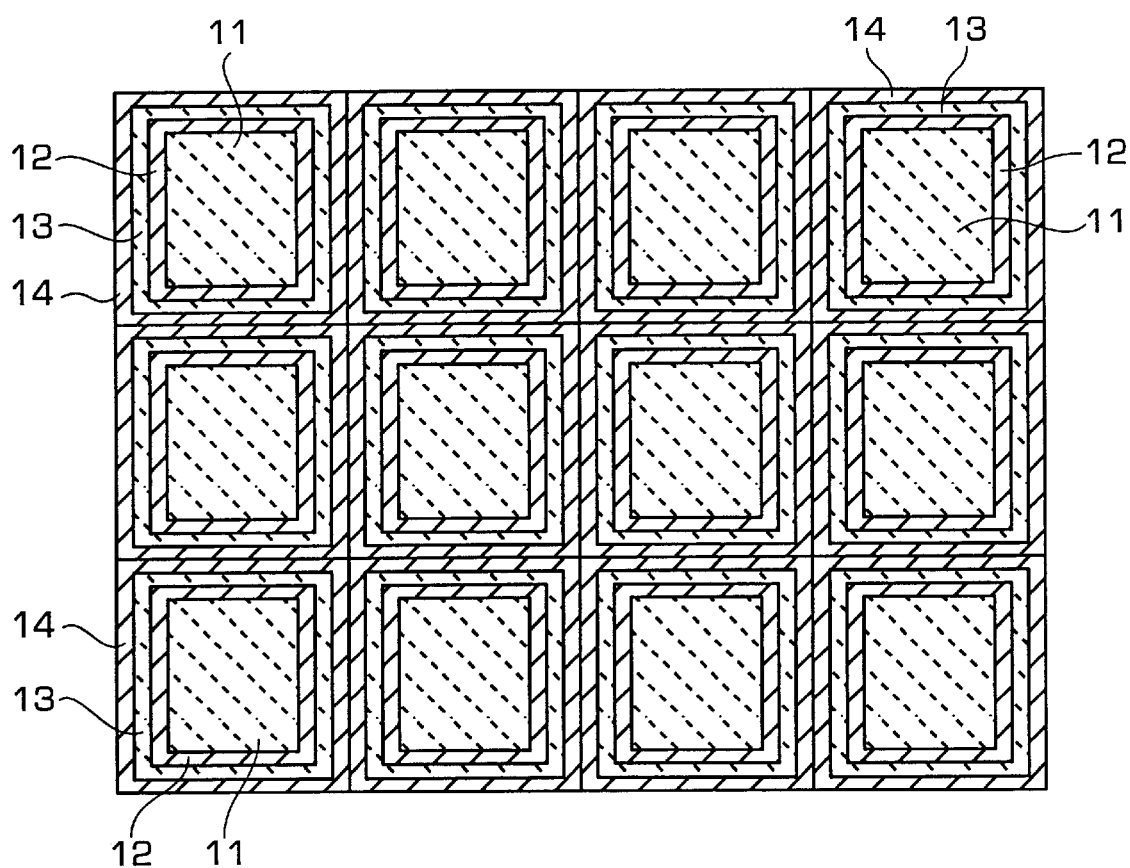
FIG. 2 shows a detail of the square version of the multifilament strand of the invention shown in FIG. 1.

In the following description, "non-superconductive material" is used to mean a material which has no superconductive property at the operating temperature of HTc superconductors, i.e. its resistivity is not zero (about 2 m$\Omega$/cm).

In addition, "permeable to oxygen" is used to mean that the material in question is in reversible equilibrium with oxygen. This means that the absorbed oxygen forms reversible oxides with the components of the material (as with Ag). As a result, if there is an oxygen demand from the precursors, the oxides release the oxygen to the precursors.

The invention relates to a powder in tube type method of making an HTc superconductive multi-filament strand having a silver-based matrix.

A powder in tube method comprises the following steps:

a monofilament step in which:
   a first silver-based envelope is filled with powder reagents suitable, after heat treatment, for transforming into an HTc superconductive material; and
   the resulting billet is drawn down into a monofilament strand;

a first multifilament step in which:
   said monofilament strand is cut into lengths and a secondary silver-based envelope is filled with the resulting lengths, thereby making a multifilament billet; and
   the multifilament billet is drawn down in turn to form a multifilament strand;

a secondary multifilament step performed at least once, in which:
   said multifilament strand is cut into lengths and a new silver-based envelope is filled with the resulting lengths, thereby making a new multifilament billet, the new multifilament billet being drawn down in turn to form a new multifilament strand; and forming and heat treatment steps in which, respectively:
   the new multi-filament strand is formed; and
   heat treatment is applied to the formed strand.
   In order to make a significant improvement in the decoupling of the filaments in the multifilament strand while retaining permeability to oxygen, the method further comprises the following additional steps:

prior to the monofilament step:
   a composite multilayer material is prepared comprising at least one silver-based sheet, and at least one layer of non-superconductive ceramic material that is permeable to oxygen; and during the mono-filament step:
   the composite multilayer material is interposed between first and second thicknesses of silver-based material, thereby forming said first silver-based envelope.

Because it is non-superconductive, the layer of non-superconductive ceramic material that is permeable to oxygen constitutes a poorly-conducting layer that decouples the filaments from one another effectively, and because it is a ceramic that is permeable to oxygen, it enables the necessary oxygen to be delivered to the precursors via the poorly-conducting layer, so that the precursors are fully synthesized into a super-conductive phase during the synthesis heat treatment.

Advantageously, and as shown in the figures, the cross-sections of the first silver-based envelope, of the monofilament strand, of the secondary silver-based envelope, of the multifilament strand, of the new silver-based envelope, and of the new multifilament strand are preferably square or rectangular in overall shape, although any other shape, e.g. round or hexagonal, is also acceptable.

To prepare the composite multilayer material:

A polymer is mixed with a powder that is suitable, after heat treatment, for transforming into a non-superconductive ceramic material that is permeable to oxygen, mixing taking place at a temperature approximately equal to the melting point of the polymer in question so to obtain a homogeneous polymer-and-powder mixture.

At least one sheet of silver is hot compressed with the polymer-and-powder mixture at a temperature approximately equal to the melting point of the polymer in question. An intermediate composite multilayer material comprising silver alloy and homogeneous polymer-and-powder mixture is thus obtained.

The composite multilayer material comprising silver alloy and homogeneous polymer-and-powder mixture is baked at approximately the melting point of the powder so as to:
  remove the polymer;
  make the powder synthesize into non-superconductive ceramic that is permeable to oxygen; and
  make the non-superconductive ceramic that is permeable to oxygen adhere to the sheet of silver.

The composite multi-layer material is thus obtained.

Figure 3A:
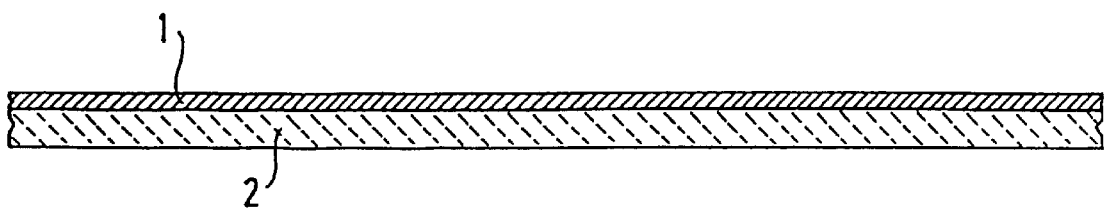
FIGS. 3A, 3B, and 3C are diagrammatic views showing variant embodiments of the composite multilayer material of the invention.
Figure 3B:
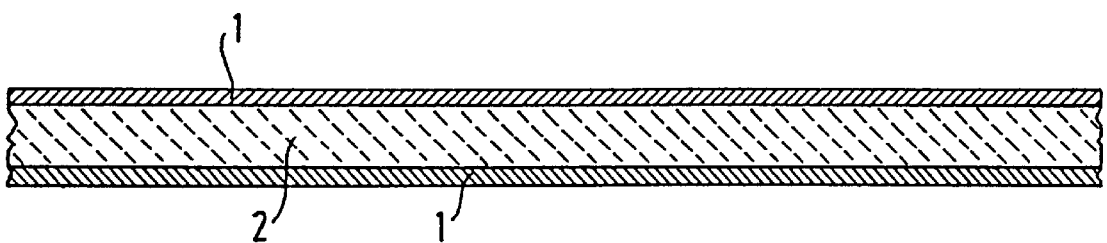
Figure 3C:
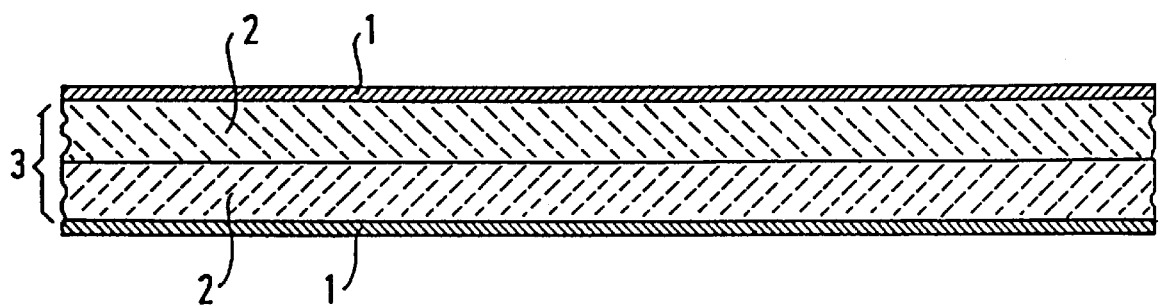

FIGS. 3A to 3C show embodiments of the composite multilayer material.

FIG. 3A shows a two-layer material having a sheet of silver 1 and a layer of non-superconductive ceramic that is permeable to oxygen 2.

FIG. 3B shows a sandwich material in which the non-superconductive ceramic material that is permeable to oxygen 2 is sandwiched between two sheets of silver 1. This is obtained by hot compressing the homogeneous polymer-and-powder mixture between two silver-based sheets. This variant embodiment makes it possible for the layer of non-superconductive ceramic that is permeable to oxygen 2 to be thicker than in the two-layer material.

FIG. 3C shows two two-layer materials whose layers of non-superconductive ceramic that is permeable to oxygen 2 are in contact with each other. This stratagem makes it possible to obtain a sandwich material in which the layer 3 (two superposed layers 2) of non-superconductive ceramic that is permeable to oxygen is even thicker than in the normal sandwich material (FIG. 3B).

Forming the composite two-layer material for the purpose of inserting it between the first and second thicknesses of silver-based material is advantageously performed in a manner such that the layer of non-superconductive material that is permeable to oxygen is compressed.

In normal sandwich material, any cracks that may appear on that side of the neutral axis which is in traction are filled in by the ceramic in compression on the other side of the neutral axis.

Similarly, in sandwich material made using the stratagem, any cracks that appear on that side of the slip plane on which the two-layer material is in traction are filled in by the ceramic in compression on the other side of the slip plane.

With sandwich materials, when the ends of the composite multilayer material overlap, provision must be made to decouple the Ag sheets that overlap.

The thickness of the layer of homogeneous polymer-and-powder mixture, and thus the thickness of the initial layer of non-superconductive ceramic that is permeable to oxygen is determined as a function of the thickness desired for the oxygen-permeable non-superconductive ceramic around the filaments of the new multifilament strand at the end of the method. For example, if a thickness in the range 1 $\mu$m to 2 $\mu$m is desired for the oxygen-permeable non-superconductive ceramic around the filament at the end of the method, and if a filament reduction factor of 400 is chosen between the monois filament and the filament of the new multifilament strand at the end of the method, then the initial thickness of the oxygen-permeable non-superconductive ceramic in the monofilament must lie approximately in the range 400 $\mu$m to 800 $\mu$m.

In a non-limiting implementation, the powder is based on Bi2212 polluted with Al, or Mg, or Ti.

In another non-limiting implementation, the powder is based on Bi2201.

The invention also provides an HTc superconductive multifilament strand comprising a plurality of superconductive filaments 10, each superconductive filament 10 comprising an HTc superconductive ceramic core 11 surrounded by first cladding of an Ag-based alloy 12, itself surrounded by a layer of non-superconductive ceramic that is permeable to oxygen 13, itself surrounded by second cladding of an Ag-based alloy 14.

The HTc superconductive filaments 10 making up the strand are contained in cladding of resistive alloy 15.

Naturally, the invention is not limited to the implementations described and shown, but rather it is susceptible of numerous variants accessible to a person skilled in the art without going beyond the invention. In particular, without going beyond the ambit of the invention, it is possible to replace the Bi2201 or the polluted Bi2212 with any other material having the same properties. The cross-sections of the filaments may be different, e.g. round or hexagonal, without going beyond the invention. The layout of the filaments in the strand may also be different without going beyond the invention. In particular, the filaments may be disposed in offset layers.

What is claimed is:

1. An HTc superconductive multifilament strand comprising a plurality of superconductive filaments, each superconductive filament comprising an HTc superconductive ceramic core surrounded by first cladding of a Ag-based alloy, itself surrounded by a layer of non-superconductive ceramic that is permeable to oxygen and does not consume oxygen, itself surrounded by a second cladding of an Ag-based alloy.

2. An HTc superconductive multi-filament strand according to claim 1, wherein the HTc superconductive filaments making up the strand are contained in cladding of resistive alloy.

3. An HTc super-conductive multi-filament strand according to claim 1, wherein the cross-sections of the filaments are square or rectangular in shape.

4. An HTc super-conductive multi-filament strand according to claim 1, wherein the cross-sections of the filaments are round or hexagonal in shape.

* * * * *